United States Patent [19]
Daniell

[11] Patent Number: 6,060,921
[45] Date of Patent: May 9, 2000

[54] VOLTAGE THRESHOLD DETECTION CIRCUIT

[75] Inventor: Philip M Daniell, Kingsclere, United Kingdom

[73] Assignee: Cypress Semiconductor Corp.

[21] Appl. No.: 08/937,597

[22] Filed: Sep. 29, 1997

[51] Int. Cl.[7] .............................. H03K 5/12; H03K 17/16
[52] U.S. Cl. .......................... 327/170; 327/108; 327/379
[58] Field of Search .................................... 327/134, 170, 327/108, 112, 379–382, 80, 81, 309; 326/26–28

[56] References Cited

U.S. PATENT DOCUMENTS

| | | | |
|---|---|---|---|
| 5,293,082 | 3/1994 | Bathaee | 327/170 |
| 5,306,965 | 4/1994 | Asprey | 327/108 |
| 5,512,854 | 4/1996 | Park | 327/108 |
| 5,537,070 | 7/1996 | Risinger | 327/170 |
| 5,610,548 | 3/1997 | Masleid | 327/379 |

*Primary Examiner*—Toan Tran
*Attorney, Agent, or Firm*—Christopher P. Maiorana, P.C.

[57] ABSTRACT

An output buffer is provided in which the output impedance of the buffer is set relatively low during an initial portion of an output transition. Subsequently, near the end of the output transition, the output impedance of the buffer is increased to more closely follow the characteristic impedance of a transmission line driven by the buffer. The output impedance is automatically changed when the buffer output voltage crosses a predetermined threshold. The output buffer includes a voltage threshold detection circuit comprising a diode and a transistor, the diode being coupled to the gate of the transistor. When a voltage level of a signal applied to one of the diode and the transistor crosses a predetermined threshold, a switch state of the diode and/or transistor changes to thereby change an output of the voltage detection circuit and trigger the change of output impedance of the output buffer in a reliable and consistent manner.

22 Claims, 2 Drawing Sheets

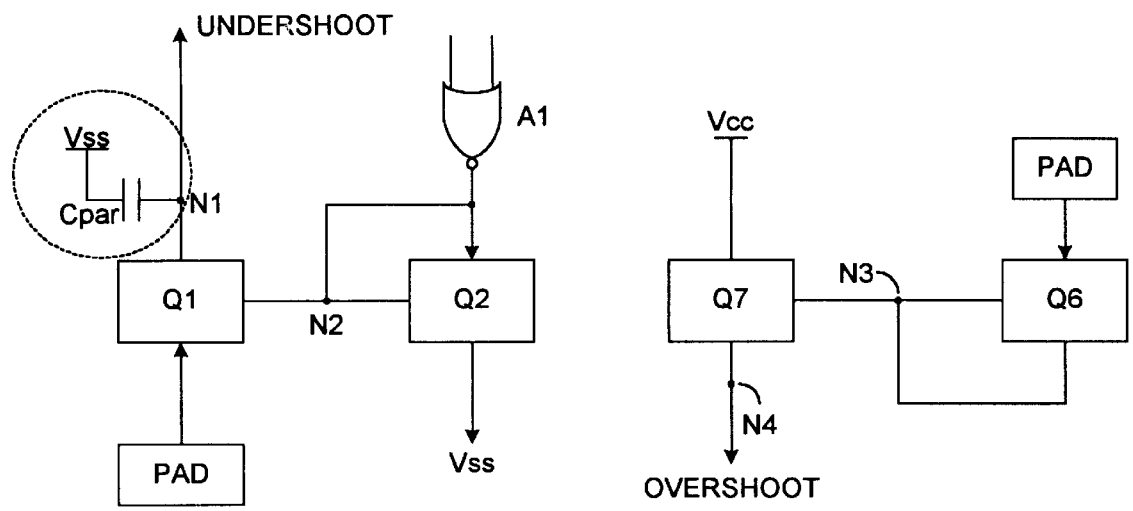
FIG. 3
FIG. 5
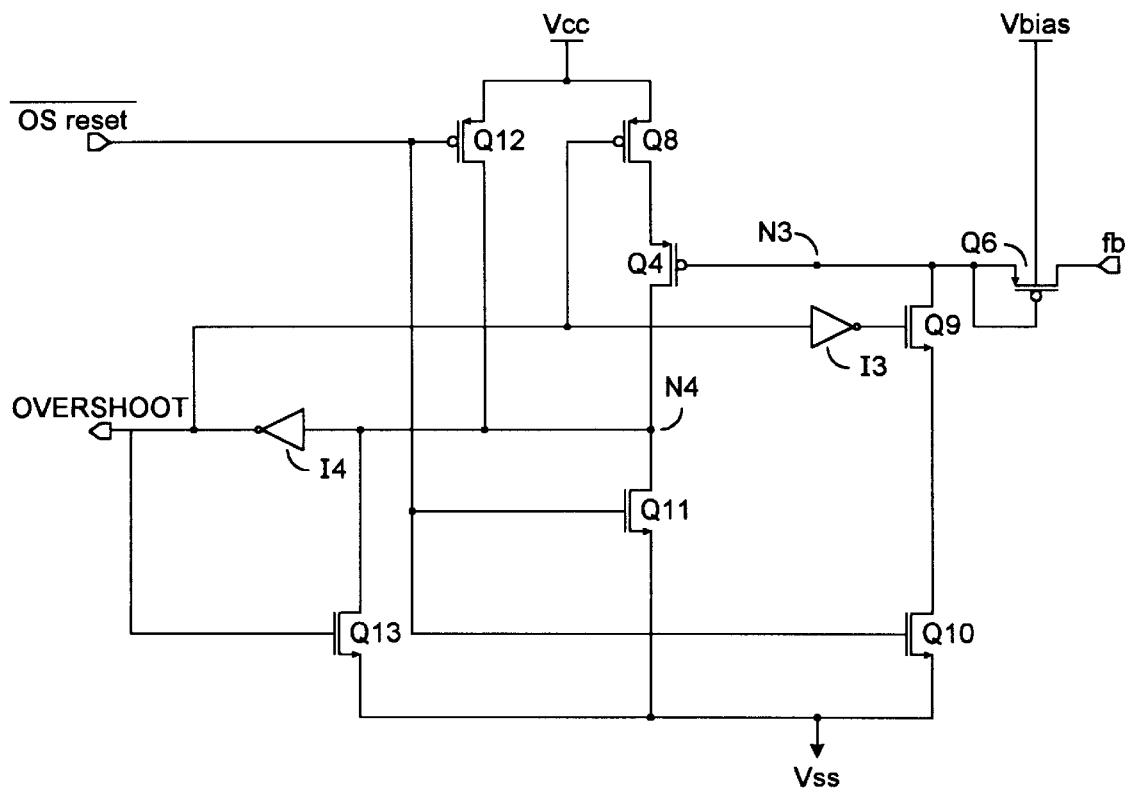
FIG. 4

VOLTAGE THRESHOLD DETECTION CIRCUIT

FIELD OF THE INVENTION

The present invention relates to a voltage threshold detection circuit, and in particular to a voltage threshold detection circuit for use with a variable impedance output buffer of an integrated circuit configured to drive a transmission line.

BACKGROUND OF THE INVENTION

A variable impedance output buffer is designed so that the output impedance of the buffer is set relatively low during an initial portion of an output transition and subsequently the output impedance of the buffer is increased near the end of the output transition to more closely match the characteristic impedance of a transmission line driven by the buffer. The output impedance is changed when a buffer output voltage crosses a predetermined threshold. It is important that the circuit is set to trigger the change of output impedance near the end of an output transition in a reliable and consistent manner. Known voltage threshold detectors that implement this variable impedance function do not always offer as reliable and consistent a detection threshold as is desired in state-of-the-art integrated circuit technologies. This can adversely affect transmission line performance.

SUMMARY OF THE INVENTION

According to a first aspect of the present invention, a voltage threshold detection circuit comprises a diode and a transistor, the diode being coupled to the gate of the transistor wherein the diode and the transistor are arranged so that when a voltage level of a signal applied to one of the diode and the transistor crosses a predetermined threshold, a switch state of one of the diode and the transistor changes to thereby change an output of the voltage detection circuit.

In one preferred embodiment of the present invention, the diode and the transistor are selected so that a voltage drop across the diode is matched with a threshold voltage of the transistor so that when a voltage level of a signal coupled to the transistor crosses a predetermined threshold the transistor is switched on.

In another preferred embodiment of the present invention, the diode and the transistor are configured to match a voltage threshold of the diode with a threshold of the transistor so that when the voltage level of a signal coupled to the diode crosses a predetermined threshold, the transistor is switched off.

According to a second aspect of the present invention, a variable impedance output buffer comprises a voltage threshold detection circuit in accordance with the first aspect of the present invention for affecting a change in output impedance.

Preferably, the output buffer further comprises a first voltage threshold detection circuit arranged as an undershoot detector and a second voltage threshold detection circuit arranged as an overshoot detector.

BRIEF DESCRIPTION OF DRAWINGS

Examples of the present invention will now be described with reference to the accompanying drawings, in which:

FIG. 3 is a simplified block diagram of the circuit of FIG. 2;

FIG. 4 is a circuit diagram of a second example of a voltage threshold detection circuit in accordance with the present invention; and, FIG. 5 is a simplified block diagram of the circuit of FIG. 4.

DETAILED DESCRIPTION

Figure 1:
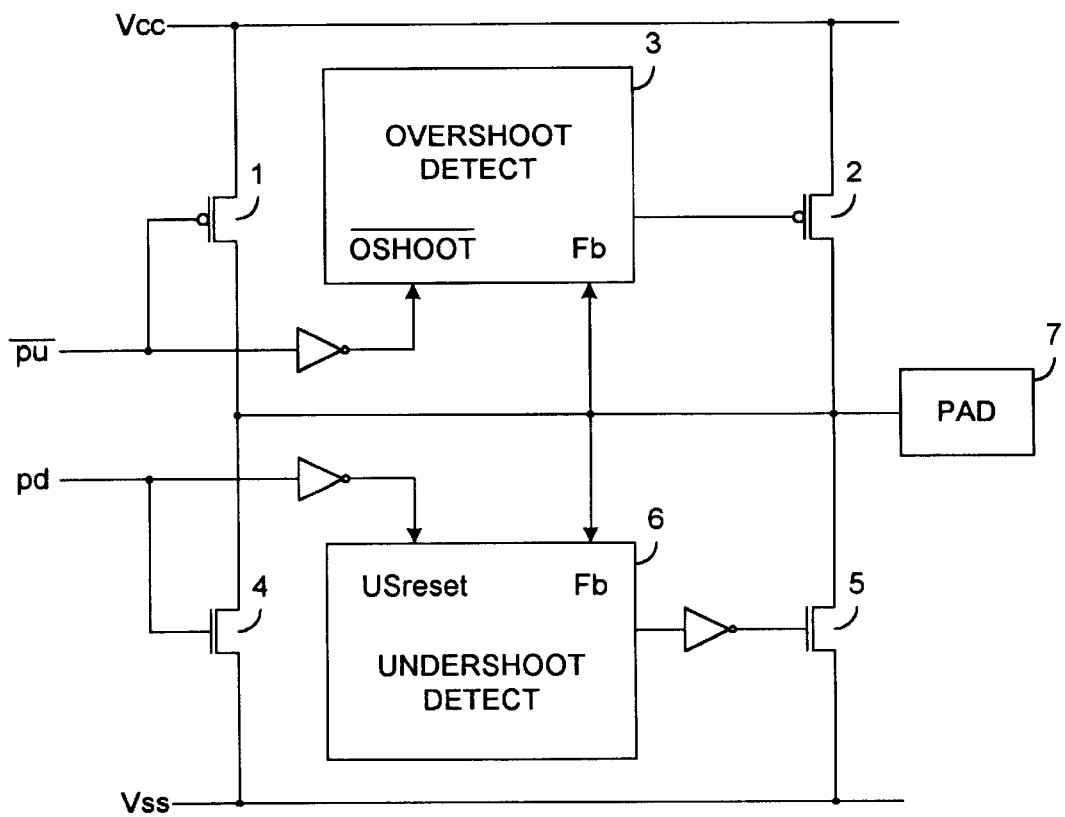
FIG. 1 is a block diagram of a variable impedance output buffer.

FIG. 1 shows a variable impedance output buffer circuit. The circuit includes a first pull-up transistor 1 connected in parallel to a second pull-up transistor 2. The switching of the second pull-up transistor 2 is controlled by an overshoot detector circuit 3. On the pull-down side of the buffer circuit, a first pull-down transistor 4 is connected in parallel to a second pull-down transistor 5 which is controlled by an undershoot detect circuit 6. The output impedance of the buffer circuit is a reflection of the combination of the impedances presented by the parallel pairs of pull-up and pull-down transistors. The circuit operates as follows: when an input signal approaches the end of a high going transition, the overshoot detect circuit 3 turns the second pull-up transistor 2 off to remove its conductance from the parallel pair of pull-up transistors, thereby increasing the buffer output impedance so that it substantially matches a characteristic impedance of a transmission line (not shown) driven by the buffer via a pad 7. For a low going transition, the undershoot detects circuit 6 turns the second pull-down transistor 5 off to increase the buffer output impedances at the end of the high to low transition period. A control signal USreset is activated when the pad 7 is not being driven low by either of the pull-down transistors 4 or 5. The control signal is derived from the signal pd controlling the gate of the first pull-down transistor 4 and is used to reset the undershoot detect circuit 6 prior to a low going transistor. Another control signal $\overline{OSreset}$ is derived from a signal $\overline{pu}$ controlling the gate of the first pull-up transistor 1 and is used to reset the overshoot detect circuit 3 prior to a high going transition. The control signal $\overline{OSreset}$ is active when the pad 7 is not being driven high by either of the pull-up transistors 1 or 2. When the output driver is tristate i.e. when the output buffer is not driving the pad 7, neither of thee control signals are active.

The output buffer circuit of FIG. 1 allows the output impedance to be varied for both falling and rising edges. In practice, however, output buffers may be used in applications where varying the impedance is only needed for one type of transition. For example, if the ringing at the end of the transition from low to high is unlikely to cause an input buffer receiving the transition to trigger falsely then impedance matching for this transition is unnecessary. In this case, only the appropriate components for undershoot prevention need to be included in the output buffer circuit.

Figure 2:
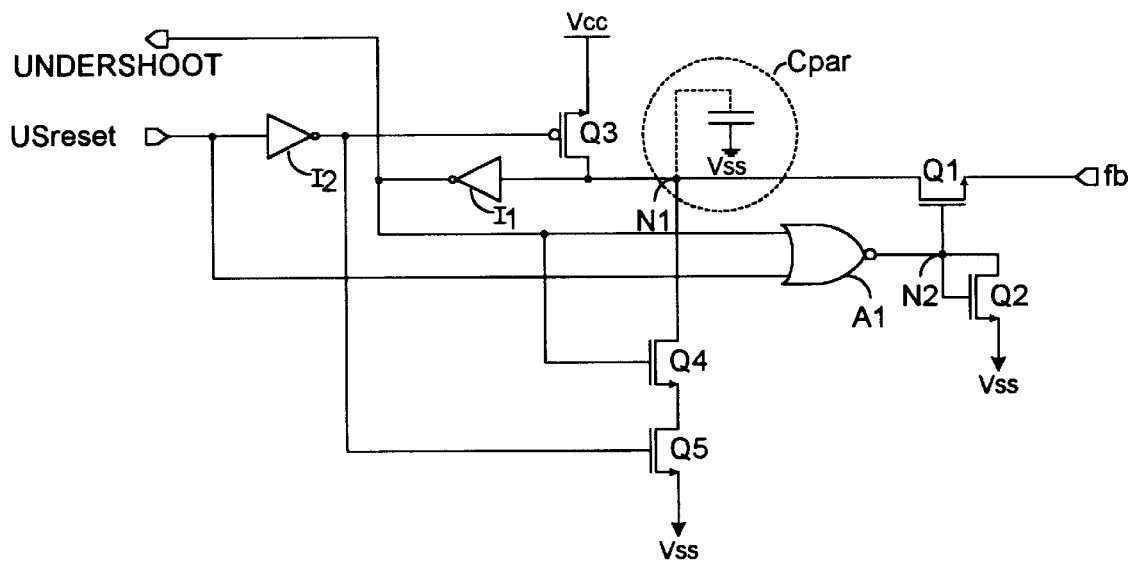
FIG. 2 is a circuit diagram of a first example of a voltage threshold detection circuit in accordance with the present invention.

FIGS. 2 and 3 show an example of an undershoot detect circuit for use with the variable impedance output buffer of FIG. 1. The circuit is designed to detect transitions on an output of the variable impedance output buffer via a feedback signal $F_b$ at or close to zero volts and change the output impedance of the buffer via an undershoot detect signal. The feedback input $F_b$ to the circuit is connected to an output pad, as shown in FIG. 1.

The circuit operates as follows: when the output of the pad is tristate or high, the e control input USreset is high so that a node N1 with a capacitance $C_{ptr}$ (parasitic in this case) is charged high through transistor Q3. A node N2 is pulled low by the output of the NOR gate G1. During a low going transition, the control input USreset goes low, transistor Q3 turns off, and the node N1 is maintained high. Although the output of the NOR gate G1 is asserted, the pull-up devices of G1 are preferably sized such that they exhibit a high on resistance, so that the voltage level at node N2 rises to a value substantially $V_{TN}$ above a negative supply voltage $V_{SS}$ (gorund), where $V_{TN}$ is the diode voltage of a diode presented by transistor Q2. When the output of the pad reaches a detection threshold of substantially zero volts, transistor Q1 turns on and the voltage at the node N1 is discharged through transistor Q1 to the pad, causing the undershoot output to go high via inverter I1. The undershoot output of the circuit turns the pull-down transistor of the output buffer of FIG. 1 off, thereby increasing the output impedance of the output buffer. After this transition, the output of the NOR gate G1 goes low and the voltage at node N1 is pulled low through transistors Q4 and Q5, thereby ensuring that the undershoot output remains high until the control signal USreset next goes high.

An advantage of this circuit design is that the undershoot output will always go high i.e., the circuit will always trigger, even if the feedback input $F_b$ from the pad never quite reaches zero volts for some reason, since the voltage at node N1 will leak slowly through transistor Q1. The pre-charged node N1 virtually eliminates current being introduced into the feedback path. Accordingly, any resistance introduced between transistor Q1 and the pad will have a negligible effect on the detection threshold.

As shown in FIG. 3, the key components in the undershoot detect circuit are the transistors Q1 and Q2, the gates of which are connected together. Transistor Q2 is diode connected and the matching of the transistor Q1 turn-on point with the diode voltage of the diode presented by the transistor Q2 ensures a consistent voltage detection point at near zero voltage levels and avoids premature triggering. Fine tuning of the detection threshold is achieved by the ratio of the sizes of the pull-up devices of NOR gate G1 and transistor Q2, thereby setting the bias voltage to the gate of transistor Q1.

FIGS. 4 and 5 show an example of an overshoot detector circuit for use with the variable impedance output buffer of FIG. 1. The circuit is designed to detect transitions on an output of the variable impedance output buffer via a feedback signal $F_b$ at or close to a supply voltage Vcc. The feedback input $F_b$ to the circuit is connected to an output pad, as shown in FIG. 1. The circuit is arranged to provide a consistent voltage threshold for changing the output impedance of the output buffer via an overshoot detect signal.

The circuit operates as follows: the voltage at node N3 will substantially be at a diode voltage $V_{TP6}$ of diode connected transistor Q6 below the voltage of the feedback input $F_b$ when the series connected transistors Q9 and Q10 are switched on. Transistors Q9 and Q10 are preferably sized such that their on resistance is large when compared with transistor Q6. Transistor Q7 will switch off when the voltage at node N3 is at a value of Vcc-$V_{TP7}$, where $V_{TP7}$ is the threshold voltage of transistor Q7. Hence, as the voltage of the feedback signal $F_b$ rises above Vcc, transistor Q7 will turn off and allow the voltage at node N4 to be pulled down by a transistor Q11, preferably sized such that its or resistance is large in comparison to that of transistor Q7. Inverter I3 and transistor Q13 provide a latching function to hold the overshoot output high, thereby turning the second pull-up transistor 2 of the variable impedance output buffer off to increase the output impedance of the output buffer. Transistor Q12 is arranged to reset the circuit in response to a control signal $\overline{OSreset}$ by forcing the voltage at node N4 high and hence the overshoot output low.

Transistors Q8 to Q11 prevent leakage when the overshoot output is high and/or during a reset mode ($\overline{OSreset}$ low). Fine adjustment of the threshold voltage for the circuit can be achieved by appropriate sizing of transistors Q10 and Q11 relative to transistors Q6 and Q7. As shown, the well voltage of transistor Q6 is biased by a suitable voltage source to prevent the well junction of transistor Q6 being forward biased with respect to the feedback input $F_b$.

As shown in FIG. 5, the key components in the overshoot detect circuit are the gate connected transistors Q6 and Q7. Transistor Q6 is diode connected and the matching of the diode voltage $V_{TP6}$ of the diode presented by transistor Q6 with the voltage threshold $V_{TP7}$ of transistor Q7 ensures a consistent voltage detection threshold.

As will be appreciated, the circuits in FIGS. 2 and 4 can instead be used as overshoot and undershoot detector circuits, respectively, simply by swapping all NMOS components for PMOS components (including those associated with the NOR gate G1 in FIG. 2), and vice versa, swapping connections to the supply voltages VCC and VSS, and by inverting the sense of the input and output signals.

I claim:

1. A voltage threshold detection circuit comprising:
   a diode and a transistor, the diode being coupled to the gate of the transistor, wherein the diode and the transistor are arranged so that (i) when a voltage level of a signal applied to one of the diode and the transistor crosses a predetermined threshold, a switch state of one of the diode and the translator changes to thereby change an output of the voltage detection circuit and (ii) a voltage drop across the diode is matched with a threshold voltage of the transistor so that when a voltage level of a signal coupled to the transistor crosses a predetermined threshold the transistor is switched on; and
   a charging circuit coupled to the source-drain path of the transistor configured to bring a voltage at a first node to a predetermined level before said signal crosses said predetermined threshold, whereby when the transistor is switched on, a voltage at the first node is discharged through the transistor and the output of the voltage threshold detection circuit is changed.

2. A circuit according to claim 1, in which the charging circuit is responsive to a control signal.

3. A circuit according to claim 1, further comprising a latch circuit coupled to said first node for holding said first node at a second predetermined level for a predetermined time after said signal crosses said predetermined threshold to maintain the output of the voltage threshold detection circuit in a predetermined state.

4. A circuit according to claim 3, in which said latch circuit is responsive to a control signal.

5. A circuit according to claim 3 or 4, in which said latch circuit is a pull-down circuit.

6. A circuit according to claim 1, further comprising a bias circuit coupled to a second node between the diode and the gate of the transistor, said bias circuit being configured to produce a potential difference across the diode having a value substantially equal to the threshold voltage of the diode.

7. A circuit according to claim 6, in which said bias circuit is configured to produce said potential difference before said signal crosses said predetermined threshold.

8. A circuit according to claim 6, in which the bias circuit comprises a logic gate responsive to the output of the voltage threshold detection circuit and to a control signal.

9. A circuit according to any of claims 6 or 8, in which said bias circuit is a pull-up circuit.

10. A voltage threshold detection circuit comprising:
   a diode and a transistor, the diode being coupled to the gate of the transistor, wherein the diode and the transistor are arranged so that when a voltage level of a signal applied to one of the diode and the transistor crosses a predetermined threshold, a switch state of one of the diode and the translator changes to thereby change an output of the voltage detection circuit, in which the diode and the transistor are configured to match a threshold voltage of the diode with a threshold of the transistor so that when the voltage level of a signal coupled to the diode crosses a predetermined threshold, the transistor is switched off; and
   a voltage bias circuit configured to provide a voltage substantially equal to the voltage of said signal less a threshold voltage of the diode to appear at a first node coupled to the diode and the gate of the transistor before said signal crosses said predetermined threshold.

11. A circuit according to claim 10, further comprising a voltage bias circuit configured to provide a voltage substantially equal to the voltage of said signal plus a threshold voltage of the diode to appear at a first node coupled to the diode and the gate of the transistor before said signal crosses said predetermined threshold.

12. A circuit according to claim 10 or 11, in which said voltage bias circuit is responsive to a control signal.

13. A circuit according to claim 10, further comprising a latch circuit configured to maintain the output of the voltage threshold detection circuit in a predestined state once said signal has crossed said predetermined threshold.

14. A circuit according to claim 13, in which the latch circuit is responsive to a control signal applied to the circuit.

15. A circuit according to claim 1, in which the diode comprises a diode connected transistor.

16. An output buffer comprising:
   a voltage threshold detection circuit comprising a diode and a transistor, the diode being coupled to the gate of the transistor, wherein the diode and the transistor are arranged so that when a voltage level of a signal applied to one of the diode and the transistor crosses a predetermined threshold, a switch state of one of the diode and the translator changes to thereby change an output of the voltage detection circuit; and
   an output driver having an impedance that changes in response to a change in the output of the voltage threshold detection circuit, wherein said output buffer has a relatively low output impedance during an initial portion of an output transition.

17. A circuit according to claim 16, wherein said voltage threshold detection circuit is configured as an overshoot detector.

18. A circuit according to claim 16, wherein said voltage threshold detection circuit is configured as an undershoot detector.

19. An output buffer according to claim 17, comprising a further voltage threshold detection circuit configured as an undershoot detector coupled to the output driver.

20. An output buffer according to claim 16, wherein said output driver comprises a pull-up transistor and a first pull-down transistor, the first pull-down transistor being configured selectively to couple the output to a low level voltage, and wherein said output buffer further comprises a second pull-down transistor switchably coupled in parallel with the first pull-down transistor when an output of the voltage threshold detection circuit is in a first stage during a high to low output transition, and uncoupled from the first pull-down transistor when the output of the voltage threshold detection circuit is in a second stage during a high to low output transition to thereby increase the buffer output impedance.

21. An output buffer according to claim 16, wherein said output driver comprises a first pull-up transistor and a pull-down transistor, the first pull-up transistor being configured selectively to couple the output to a high level voltage, and said output buffer further comprises a second pull-up transistor switchably coupled in parallel with the first pull-up transistor when an output of the voltage threshold detection circuit is in a first state during a low to high output transition, and uncoupled from the first pull-up transistor when the output of the voltage threshold detection circuit is in a second state during a low to high output transition to thereby increase the buffer output impedance.

22. An output buffer according to claim 16, wherein the output impedance is changed to match substantially a characteristic impedance of a transmission line coupled thereto in response to the output of the voltage threshold detection circuit.

* * * * *